United States Patent
Kagami

(10) Patent No.: US 7,049,838 B2
(45) Date of Patent: May 23, 2006

(54) SEMICONDUCTOR DEVICE TESTER WITH SLANTED CONTACT ENDS

(75) Inventor: Sumio Kagami, Kumamoto (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/918,341

(22) Filed: Aug. 16, 2004

(65) Prior Publication Data
US 2005/0127935 A1   Jun. 16, 2005

(30) Foreign Application Priority Data
Dec. 10, 2003 (JP) .................... 2003-412027

(51) Int. Cl.
*G01R 31/02* (2006.01)
(52) U.S. Cl. .................. 324/754; 324/761
(58) Field of Classification Search ............ None
See application file for complete search history.

(56) References Cited

U.S. PATENT DOCUMENTS

| | | | |
|---|---|---|---|
| 5,600,259 A | * | 2/1997 | Bartyzel et al. ............ 324/761 |
| 5,734,270 A | * | 3/1998 | Buchanan ................... 324/754 |
| 5,993,269 A | | 11/1999 | Ito |
| 6,084,421 A | * | 7/2000 | Swart et al. ................ 324/755 |
| 6,512,389 B1 | * | 1/2003 | Kocher ....................... 324/755 |
| 6,844,748 B1 | * | 1/2005 | Sato et al. .................. 324/754 |

FOREIGN PATENT DOCUMENTS

| JP | 10-189087 | | 7/1998 |
|---|---|---|---|
| JP | 2001021583 A | * | 1/2001 |

\* cited by examiner

*Primary Examiner*—Minh N. Tang
(74) *Attorney, Agent, or Firm*—Rabin & Berdo, PC

(57) ABSTRACT

A semiconductor tester device includes at least a probe having a plunger making contact with a semiconductor device at one end and being slanted at the other end, and an elastic member able to shrink when pressed with the plunger; and a print substrate with wiring formed to test the semiconductor device; wherein the print substrate has at least a hole to put the probe in, and the hole has an electrically conductive wall to make contact with a side end of the plunger when the elastic member is pressed at the slanted end of the plunger.

6 Claims, 5 Drawing Sheets

SEMICONDUCTOR DEVICE TESTER WITH SLANTED CONTACT ENDS

BACKGROUND OF THE INVENTION

1. Field of the Invention

The present invention relates to a semiconductor device tester for obtaining electric characteristics of semiconductor device called BGA (Ball Grid Array) having outer input/output terminals arrayed in lattice on base, especially a semiconductor device tester with a print substrate to print wiring for tester circuit.

2. Description of Related Art

The conventional semiconductor device tester comprises a semiconductor socket for electrically connecting with outer input/output terminals (solder balls) of a semiconductor device to be tested, and a print substrate attaching the semiconductor substrate (c.f. U.S. Pat. No. 5,993,269 Ito).

According to the conventional art mentioned above, as shown in a plan view of FIG. 2(a) and a sectional view of FIG. 2(b), the conventional semiconductor device tester 10 comprises a semiconductor socket 20 and a print substrate 30. The semiconductor socket 20 comprises a stage 21 to decide position of semiconductor device, a probe 22 to obtain electric contact with outer input/output terminal of semiconductor device, a socket base 23 to hold the probe 22, a front lid 24 to keep the probe 22 held in the socket base 23, a spring 25 to separate the stage 21 from the socket base 23, a guide pin 26 to guide the stage 21 in vertical direction over the socket base 23, and a fixing bolt 27 to keep the guide pin 26 held in the socket base 23.

The print substrate 30 is electrically connected, via the probe 22, with the outer input/output terminal of a semiconductor device positioned by the semiconductor socket 20. And, the semiconductor socket 20 is fixed to the print substrate 30 with a socket guide pin 31 and a composing bolt 32. Here, the socket guide pin 31 is to guide the socket base 23 in vertical direction over the print substrate 30.

The print substrate 30 is formed at a thickness of about 3 mm. And, on its front surface, there is a contact terminal for contacting with the probe 22. Further, on its back surface, there is wiring which is electrically contacted with the contact terminal for contacting with the probe 22. A circuit of a tester is formed with wiring on the print substrate 30. And, a measuring apparatus is connected with wiring (of the circuit of the tester). Thereby, electric characteristics of semiconductor device is measured with the measuring apparatus. The probe 22 comprises, as shown in FIG. 3, a ball plunger 33 to contact with solder ball, a substrate plunger 34 to contact with wiring of the print substrate 30, a spring 35 to be put between the ball plunger 33 and the substrate plunger 34, and a case 36 to hold the spring 35, the ball plunger 33 and the substrate plunger 34. The case 36 has a length of about 6 mm and a radius of about 0.5 mm.

The ball plunger 33 comprises an electrically conductive pole having a contact portion 37 or a grip portion 38 at each end of the pole. The contact portion 37 is a portion to obtain good contact with the solder ball. The grip portion 38 is a portion to hold an end of the ball plunger 33 in the case 36. Thereby, the grip portion 38 is movable only in the case 36 in vertical direction with a prescribed stroke, and the ball plunger 33 moves with the grip portion 38 outside of the case 36 in same vertical direction with same prescribed stroke. A pinched portion 39 is formed in the vicinity of top end portion of the case 36. And, the grip portion 38 stops at the pinched portion 39, because inner radius of the pinched portion 39 is smaller than outer radius of the grip portion 38. Thereby, the ball plunger 33 is held in the case 36.

The substrate plunger 34 comprises an electrically conductive pin 40 and a grip portion 41. And, the electrically conductive pin 40 is protruded from a hole formed in base of the case 36. The grip portion 41 stops at the base of the case 36, because inner radius of the hole of the base is smaller than outer radius of the grip portion 41. Thereby, the substrate plunger 34 is held in the case 36.

Moreover, in the case 36 mentioned above, there are electrically conductive balls not shown in the drawings, between the grip portion 38 and the spring 35, and between the spring 35 and the base of the case 36. And, lower end of the grip portion 38 is slanted (c.f. Ito). Then, the grip portion 38 and the ball are pressed to inner wall of the case 36 in opposite direction, when the spring 35 works. Thereby, conductivity of electricity between the grip potion 38 and the inner wall, and between the ball and the inner wall, further between the grip portion and the ball, is secured.

Further, as other prior art, there is a probe without case like case 36 shown in FIG. 3. This kind of probe is put in a hole formed in a socket base like the socket base 23 shown in FIG. 2(b). And, a spring 35 between a grip portion 38 and a grip portion 41 like those shown in FIG. 3, works in the hole formed in a socket base 23. Then, upper portion of this kind of probe contacts with an outer input/output terminal of a semiconductor device. And, lower portion of this kind of probe contacts with a print substrate. Further, a grip portion 38 and a grip portion 41 like those shown in FIG. 3, contact with each other, when the spring 35 shrinks.

Meanwhile, whichever probe mentioned above is adopted, base of the probe makes contact with a contact terminal of a print substrate, and the contact terminal electrically makes contact with wiring formed beneath back face of the print substrate. Therefore, the semiconductor device electrically makes contact, via the probe, with wiring of a tester circuit formed on the print substrate.

The conventional tester device shown in FIG. 2 operates as follows. A semiconductor device to be tested, is put on the stage 21. There, the semiconductor device is positioned. Thereafter, the outer input/output terminal of the semiconductor device makes contact with the probe 22 (ball plunger), when the stage 21 comes closer to the socket base 23. Further, spring of probe 22 put in the socket base 23 shrinks, when the stage 21 comes even closer to the socket base 23. Then, good conductivity of electricity is secured between the outer input/output terminal of the semiconductor device and the probe 22. As mentioned before, the probe 22 is electrially connected with the tester circuit on the print substrate 30. Therefore, the semiconductor device is electrially connected, via the probe 22, with the tester circuit on the print substrate. Then, in this situation, electrical characteristics of semiconductor device is measured.

Meanwhile, a semiconductor device in these days, operates very fast with fast clock. Therefore, fast signal is inputted or outputted through input/output terminal of semiconductor device, which operates according to such a fast signal. This fast signal transmits between the semiconductor device and the wiring formed on the print substrate, via the probe 22.

Meanwhile, this kind of fast signal delays, owing to distance from the outer input/output terminal to the wiring (for the tester circuit); that is, distance of about 9 mm; consisted of about 6 mm of length of the probe 22, and about 3 mm of thickness of the print substrate. Therefore, by delay of transmission of fast signal, the conventional semiconductor tester device could not measure proper characteristics of a semiconductor device. And, this is a problem.

Therefore, the present invention aimed at providing a semiconductor tester device to be able to measure proper characteristics of a semiconductor device.

SUMMARY OF THE INVENTION

According to the present invention, there is provided following configuration to solve above problem.

What is provided is a semiconductor tester device comprising at least a probe having a plunger making contact with a semiconductor device at one end and being slanted at other end, and an elastic member able to shrink when pressed with said plunger; and a print substrate with wiring formed to test said semiconductor device; wherein said print substrate has at least a hole to put said probe in, and said hole has electrically conductive wall to make contact with a side end of said plunger when said elastic member is pressed at said slanted end of said plunger.

Moreover, said print substrate has multi-layered structure so that said electrically conductive wall is connected with either of plural wiring.

Further, said probe has an electrically conductive plunger with slanted top, beneath said elastic member.

DESCRIPTION OF THE PREFERRED EMBODIMENTS

Hereinafter, preferred Embodiment of present invention will be described, referring to the accompanying drawings.

Embodiment

<Configuration>

Figure 1A:
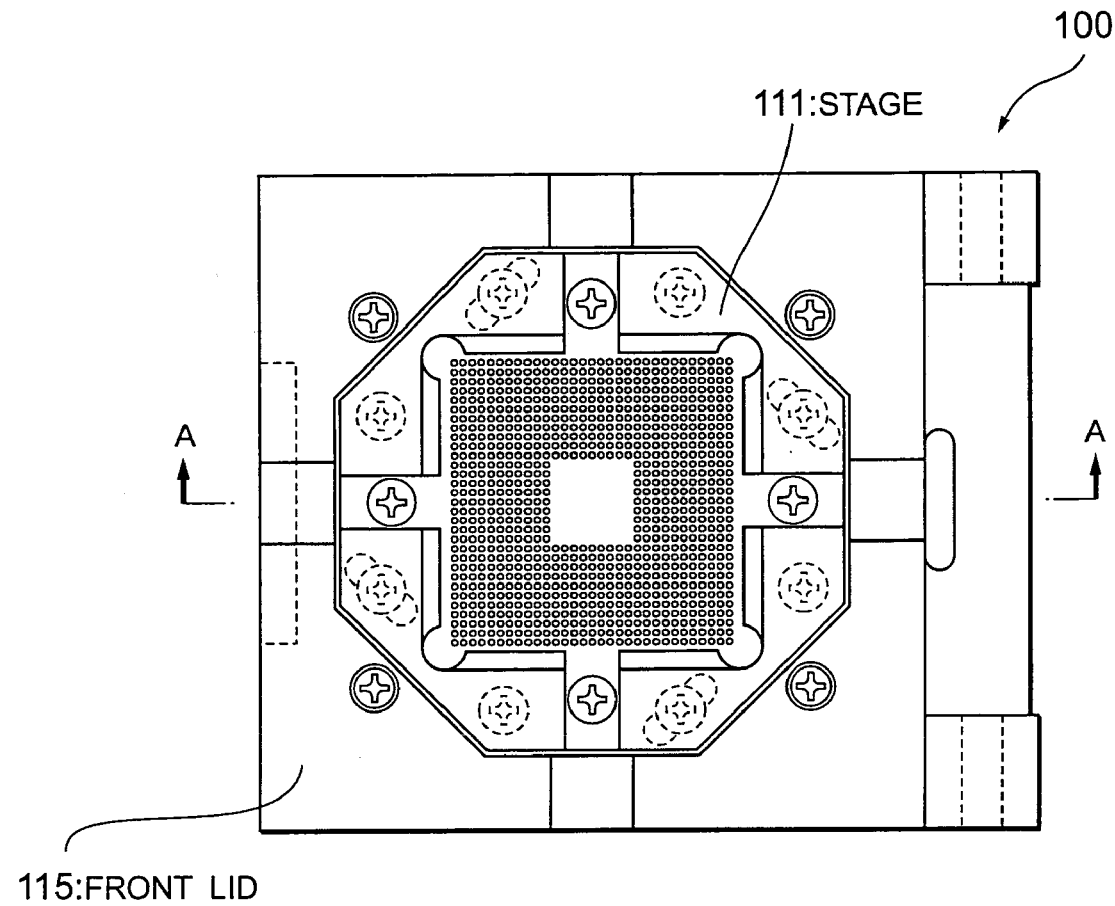
FIG. 1 shows a semiconductor device tester according to present invention; (a) is a plan view, and (b) is a sectional view.
Figure 1B:
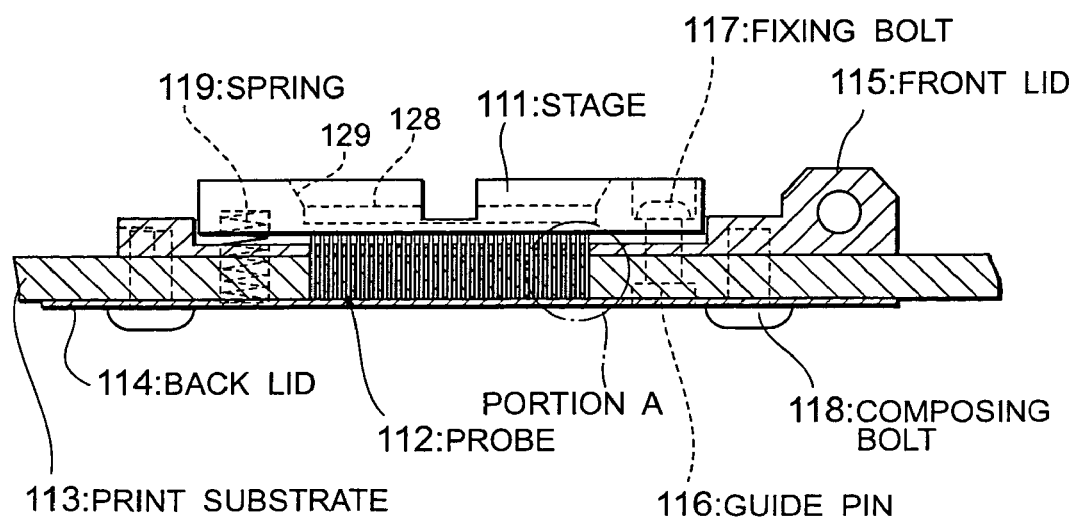
Figure 2A:
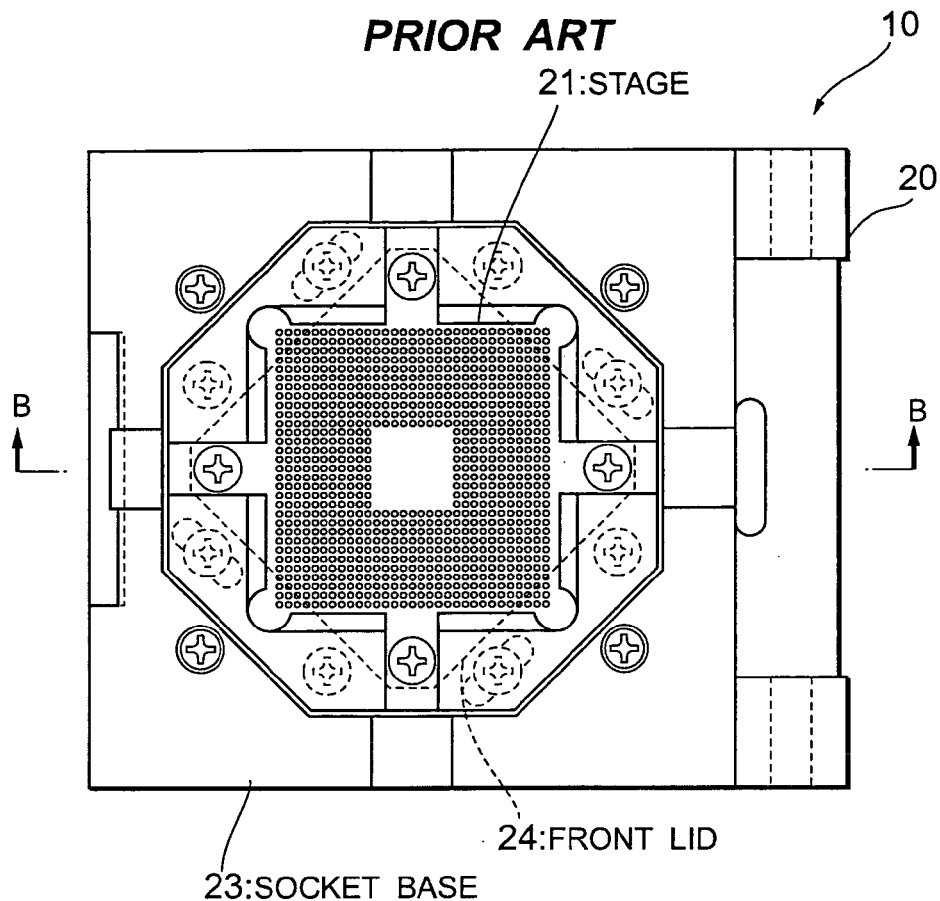
FIG. 2 shows a semiconductor device tester of prior art; (a) is a plan view, and (b) is a sectional view.
Figure 2B:
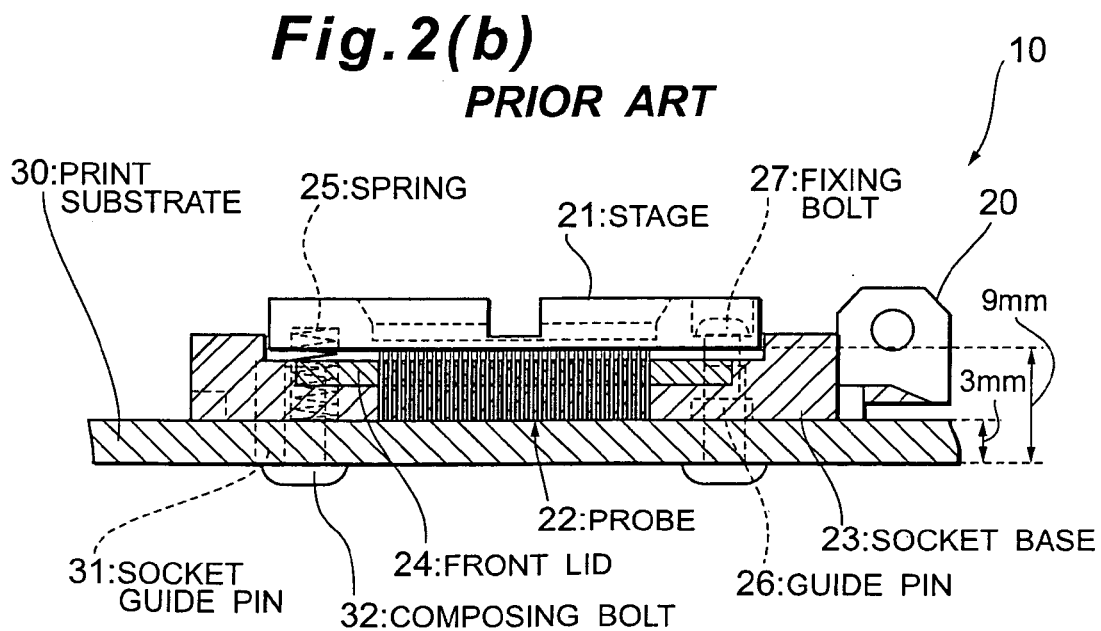

The semiconductor device tester of present invention comprises, as shown in a plan view of FIG. 1(a) and a sectional view of FIG. 1(b), a stage 111 to decide position of semiconductor device, a probe 112 to obtain electrical contact with outer input/output terminal of semiconductor device, a print substrate 113 (not shown in FIG. 1(a)) to hold the probe 112, a back lid 114 to keep the probe 112 held in the print substrate 113 at base of the print substrate 113, a front lid 115 to keep the probe 112 held in the print substrate 113 at front surface of the print substrate 113, a guide pin 116 to guide the stage 111 and the probe 112 in vertical direction so as to separate the stage 111 from the probe 112 by a spring 119, a fixing bolt 117 to keep the guide pin 116 held in the print substrate 113, and a composing bolt 118 to fix the front lid 115 and the back lid 114 to the print substrate 113 at the base of the print substrate 113.

On the stage 111, formed is a square opening 128 with slanted side wall 129, so as to take a semiconductor device in the square opening 128 and to set the semiconductor device at a prescribed position. And, in base of the square opening 128 of the stage 111, formed is an array of holes 130 for the probes 112 to get in and to get out. Moreover, at prescribed portion of the stage 111, formed are holes to insert the guide pin 116. And, the guide pin 116 comes out through the holes of the stage 111. Then, the stage 111 is fixed to top end of the guide pin 116 by a fixing bolt 117 at the prescribed portion of the stage 111. Moreover, at another prescribed portion of base of the stage 111, formed is a recession to accept top end of a spring 119.

On the other hand, in the print substrate 113, formed are holes for holding the probes 112 corresponding to number of probes 112. These holes are through holes. Therefore, a back lid 114 to keep the probes held in the holes, is fixed by a composing bolt 118 at base of the print substrate 113. This comprising bolt 118 goes through the print substrate 113 so as to fix the front lid 115 at the top end of the print substrate 113 as well as to fix the back lid 114 at the base of the print substrate 113.

The front lid 115 fixed by the composing bolt 118, is a lid to keep the probes 112 held in the holes of the print substrate 113 against a spring force of a spring of the probes 112. Thickness of a central portion of the front lid 115, where the stage 111 is fixed, is made thinner than that of the prescribed portion of the front lid 115, where the composing bolt 118 is fixed. The central portion of the front lid 115 at least has a thickness having strength not to bent by the spring force of the spring of the probe 112, so as to keep the probes 112 held in the holes. However, the thickness is made as thin as possible.

Thereby, length of top end portion of the probes 112 emerged from top surface of the print substrate 113 (a ball plunger to be mentioned afterward), can be made as short as possible.

Figure 4:
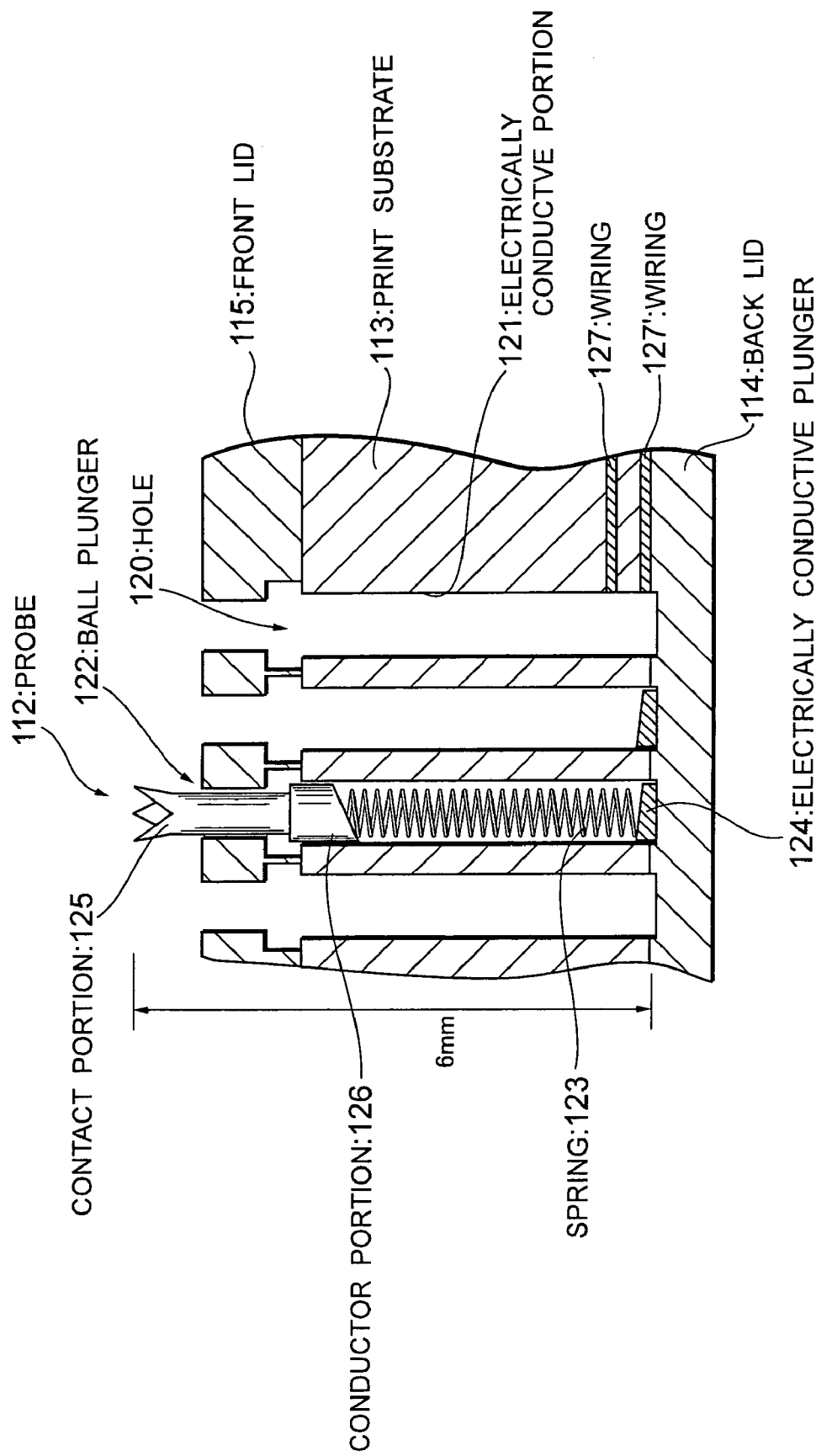
FIG. 4 is a magnified figure showing portion A of FIG. 1(b).

Here, a magnified figure of a portion A shown in FIG. 1(b), is shown in FIG. 4. And, configuration of the portion A will be described, referring to FIG. 4.

As shown in FIG. 4, in the print substrate 113, formed are holes 120 through the print substrate 113. This kind of through hole can be formed in a short time, because it is not necessary to control depth of hole dug in the print substrate 113.

On inner wall of holes 120, formed is an electrically conductive portion 121 connected to a prescribed portion of wiring 127 formed in the print substrate 113. That is, each probe 112 is connected with a prescribed portion of wiring 127 via each electrically conductive portion 121. And, each probe 112 is connected with a prescribed outer input/output terminal of a semiconductor device to be tested.

The electrically conductive portion 121 is made up of copper gilt formed on the inner wall of holes 120 by chemical deposition, and gold gilt formed on the copper gilt by deposition with taking considerable process time.

Therefore, the copper gilt is protected from oxidation, because it is covered with the gold gilt. Moreover, gold gilt penetrates into copper gilt after considerable process time. Therefore, good electric contact with wiring 127 can be obtained.

Meanwhile, the print substrate 113 can comprise either of single layered structure or multi-layered structure. As for multi-layered structure, the electrically conductive portion 121 can be connected not only with wiring 127' formed beneath base of the print substrate 113, but also with wiring 127 formed in intermediate layer of the print substrate 113.

Thus, the substrate wiring 127 is electrically connected to the electrically conductive portion 121 at an intermediate position along a length of the electrically conducting portion 121. This shown in FIG. 5.

Base opening of holes 120 is closed by the back lid 114 fixed to base of the print substrate 113 with fixing bolt 118. Thereby, the probes 112 are held in the holes 120.

The probe 112 comprises, as shown in FIG. 4, a ball plunger 122 to contact with outer input/output terminal, a spring 123 elastic and electrically conductive, and an electrically conductive plunger 124 put on the base of the hole 120. Then, a secure route of electricity conduction can be obtained by putting the electrically conductive plunger 124 on the base of the hole 120.

Length of the probe 112 is decided to let out top end of the probe 112, that is, top end of the ball plunger 122 from the through hole formed on the front lid 115, when the probe 112 is put in the hole 120 and the front lid 115 to keep the probe 112 held is placed at a prescribed position. For example, the length of the probe 112 is about 6 mm in consideration of length of the top end of the ball plunger 122 emerging from front lid 115 and thickness of the front lid 115, in the occasion when thickness of the print substrate 113 is about 3 mm.

The ball plunger 122 comprises an electrically conductive pole having a contact portion 125 and a conductor portion 126 at both ends of the pole. The contact portion 125 is a portion to obtain good contact with a solder ball of an outer input/output terminal. The conductor portion 126 is a portion to make contact with the electrically conductive portion 121 formed on the inner side wall of the hole 120. Radius of contact portion 125 is not longer than radius of the electrically conductive pole. And, radius of conductor portion 126 is longer than radius of the electrically conductive pole. Therefore, there formed is a step portion between the electrically conductive pole and the conductor portion 126. The contact portion 125 and the electrically conductive pole of the ball plunger 122 emerges from a hole formed on the front lid 115. And, radius of the hole formed on the front lid 115 is shorter than radius of the conductor portion 126. Therefore, the probe 112 is kept being held in the hole 120 by the front lid 115.

Figure 5:
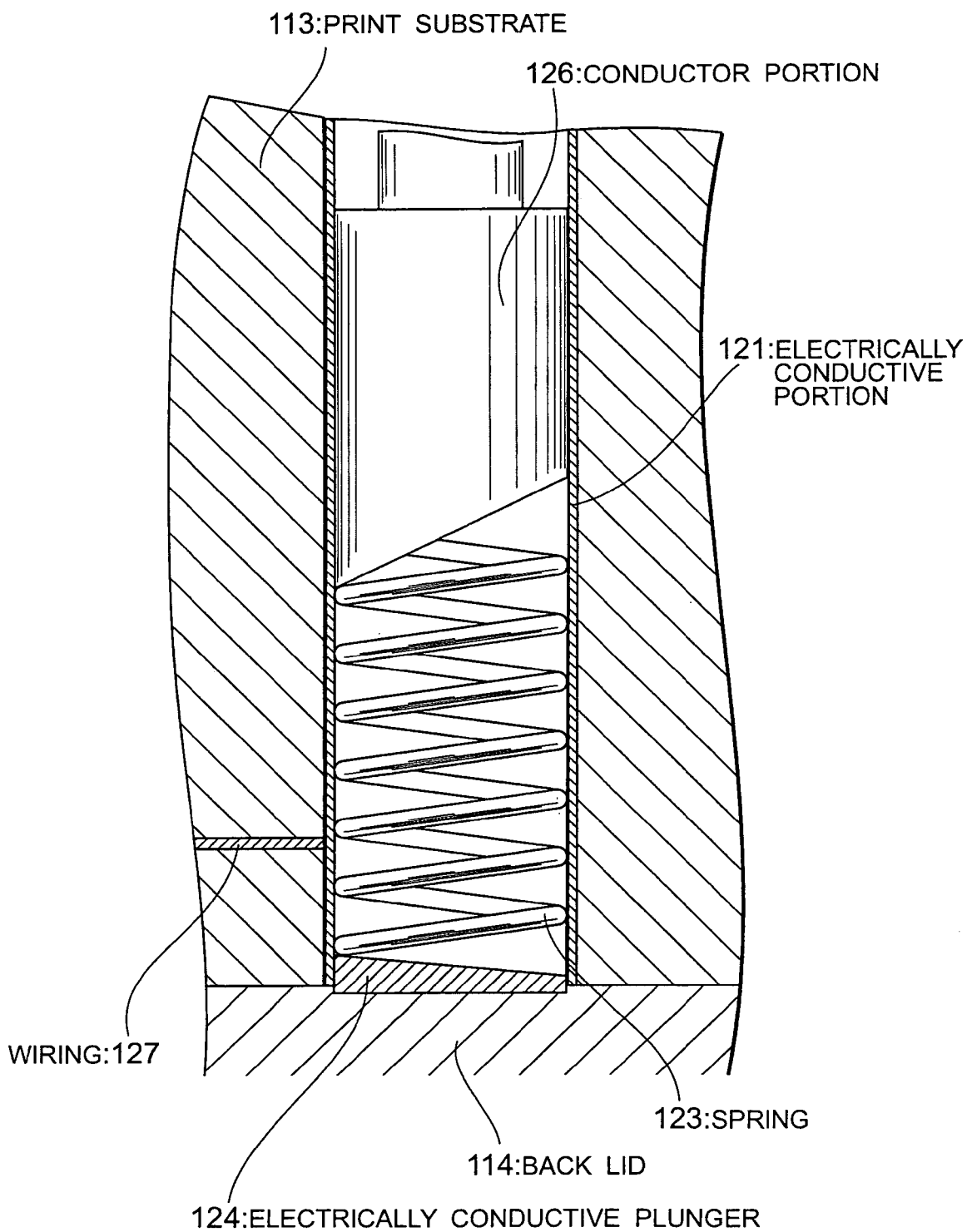
FIG. 5 is a magnified figure of FIG. 4.

Base of conductor portion 126, which makes contact with a spring 123, is slanted, as shown in FIG. 5, so that the conductor portion 126 comprises a column member with a slanted base. Thereby, the top end of spring 123 slips along the slanted base of the conductor portion 126, when the spring 123 shrinks as the conductor portion 126 descends in the hole 120. Then, a rebound force of the spring 123 is pressed at the base of the conductor portion 126. And, a side force is given to the conductor portion 126 at a contact point between the base of the conductor portion 126 and the spring 123. Then, conductivity of electricity between the conductor portion 126 and the electrically conductive portion 121 is secured, because the conductor portion 126 is pressed to the inner side wall of the hole 120, that is, the electrically conductive portion 121 formed on the inner side wall.

On the other hand, a rebound force of the spring 123 is pressed at the top of the electrically conductive plunger 124, and a side force is given to the electrically conductive plunger 124; when the bottom end of spring 123 slips along the slanted top of the electrically conductive plunger 124, as the spring 123 shrinks. Then, conductivity of electricity between the electrically conductive plunger 124 and the electrically conductive portion 121 is secured, because the electrically conductive plunger 124 is pressed to the electrically conductive portion 121 formed on the inner side wall of the hole 120.

Figure 3:
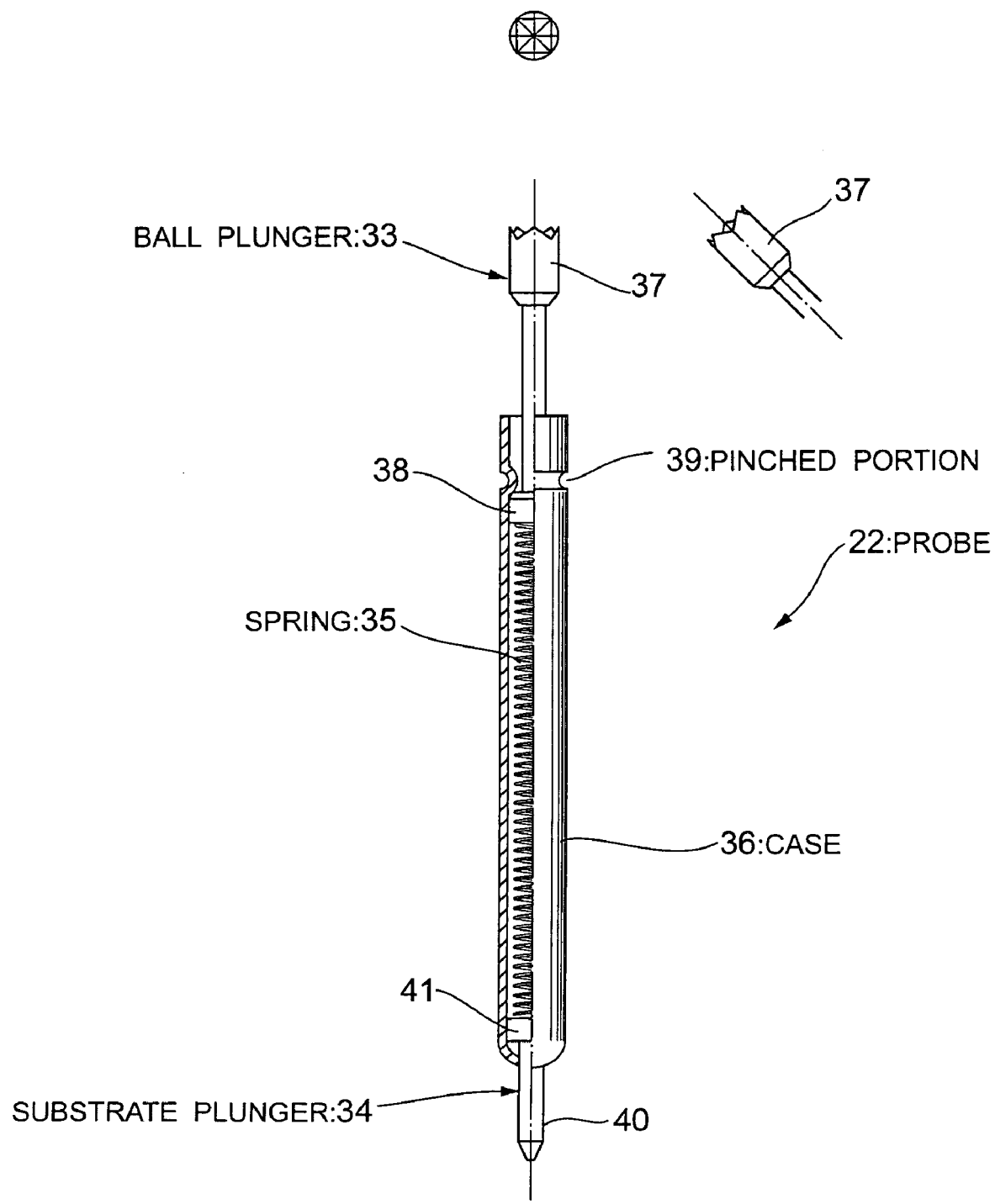
FIG. 3 shows a probe of prior art.

Meanwhile, one of the conventional art mentioned above, provides a probe not shown in the drawings, which has a structure without any case unlike the probe shown in FIG. 3 having case 36. But, it has a structure using a hole formed in a socket base; where one pin to make contact with an outer input/output terminal, other pin to make contact with a print substrate, and a spring therebetween, are put in. Therefore, conductivity of electricity of the probe is secured; when the spring shrinks as one pin is pressed, and one pin and other pin are electrically connected with each other via the spring. That is, there are upper and lower pins and the shrunk spring between a semiconductor device and wiring. Then, the lower pin to connect with wiring is necessary for route of electricity.

On the other hand, according present invention, the route of electricity is secured by the electrically conductive portion 121 formed on the inner wall of the hole 120 to connect with the print substrate 113. And, the conductor portion 126 of the ball plunger 122 corresponding to the upper pin of the conventional art, makes contact with the electrically conductive portion 121. Therefore, the spiral route along the spring 123 is replaced by the straight route along the electrically conductive portion 121. So, the route is shortened. That is, distance of the route is as short as length of the probe 112 with spring 123 shrunk. Substantially, this route is not longer than about 6 mm of distance, from top of ball plunger 122 making contact with the electrically conductive portion 121 by the conductor portion 126, to wiring connected with the electrically conductive portion 121. This is as short as two third of that of conventional art having a route of about 9 mm length.

Besides, the present invention is able to decrease number of parts of probe 112 by omitting the electrically conductive plunger 124 (lower pin) from necessity; because the electrically conductive portion 121 formed on the inner wall of hole 120, is connected with wiring formed in the print substrate 113.

The probe 112, as mentioned above, comprises ball plunger 122 with conductor portion 126, spring 123, and electrically conductive plunger 124. And, it does not need electrically conductive case to put spring 123 or each plunger 122, 123. Therefore, it is possible to decrease radius of probe 112. Thereby, it is possible to test a semiconductor device with dense array of outer input/output terminals. And, to exclude case means to decrease number of parts comprising probe 112. Then, cost for manufacturing semiconductor device tester is able to decrease. And, period for manufacturing semiconductor device tester is able to be shortened.

<Operation>

Next, operation of the semiconductor device tester 100 will be described.

A semiconductor device of BGA is put in a square opening with slanted side wall by manual or automatic operation, so as to set the device in a prescribed position. After this, the device is pressed by a handling machine not shown in the drawings. Then, spring 119 shrinks so that stage 111 descends toward top of probes put in the hole of print substrate 113. In the meantime, outer input/output terminals emerging from base of stage 111, make contact with contact portion 125 of ball plunger 122 of probe. And, the semiconductor device is still pressed so that the stage descends. Then, ball plunger 122 is pressed down. And, spring 123 positioned at base of plunger 122, shrinks.

In this occasion, top of spring 123 slips along slanted end of conductor portion 126 of ball plunger. Then, sprung force of spring 123 is pressed at base of conductor portion 126. And, side force F shown in FIG. 5 is caused. This force F is caused as if a vertical force is crooked in horizontal direction at a contact point between base of conductor portion 126 and spring 132, though this force F is branched from the sprung force of spring 123 at contact point on slanted base of conductor portion 126, to be exact. And, the conductor portion 126 is pressed to the electrically conductive portion 121 formed on the inner side wall of hole 120, by this force F. Therefore, conductivity of electricity is secured between the conductor portion 126 and the electrically conductive portion 121.

On the other hand, as same as the conductor portion 126, bottom of spring 123 slips along slanted end of electrically conductive plunger 124. Then, sprung force of spring 123 is pressed at top of electrically conductive plunger 124. And, side force G shown in FIG. 5 is caused. And, the electrically conductive plunger 124 is pressed to the electrically conductive portion 121 formed on the inner side wall of hole 120, by this force G. Therefore, conductivity of electricity is secured between the electrically conductive plunger 124 and the electrically conductive portion 121.

The electrically conductive portion 121 is connected with wiring for a circuit formed on print substrate 113. Therefore, outer input/output terminals of semiconductor device and a tester circuit of print substrate, are electrically connected with each other via probe 112 and electrically conductive portion 121.

In this state of connection, electric characteristics of a semiconductor device is measured. And, various kind of tests of electrical function is performed by semiconductor device tester of present invention.

<Effects>

Then, according to the semiconductor device tester of present invention, the probe 112 is put in the hole 120 formed in the print substrate 113. So, length of route of electricity of present invention is able to be shorter than that of the conventional device tester. Therefore, as for a semiconductor device operating with fast clock, the semiconductor device tester of present invention is able to measure performance of the device precisely, so as to perform a precise test of electric characteristics.

And, in the occasion when multi-layered structure having plural wiring to connect with each layer, is used in the semiconductor device tester mentioned above; it is possible to perform electric characteristics test of a semiconductor device having dense outer input/output terminals, which wiring cannot be formed only on the surface of the print substrate.

Other Embodiments

Although the present invention has been described in terms of the preferred embodiment having the holes 120 for probes 112 as through holes, the holes 120 can be non-through holes having bases or tops. In the occasion when having bases, probes 112 can be put from upper opening. On the other hand, in the occasion when having tops, probes 112 can be put from lower opening; and small through holes are formed at the tops to let out only contact portions 125 of ball plungers 122, from surface of print substrate.

What is claimed is:

1. A testing apparatus to test a semiconductor device, the testing apparatus comprising:
    a plurality of probes; and
    a print substrate;
    wherein the print substrate includes a plurality of holes wherein respective ones of the plurality of probes are inserted, each hole comprising on an inside wall thereof a respective electrically conducting portion, and wherein the print substrate includes substrate wiring electrically connected with each electrically conducting portion;
    wherein each probe includes an upper plunger and an elastic member disposed below the upper plunger, and the upper plunger further includes a contact portion to contact the semiconductor device and a conductor portion in contact with the elastic member inside each hole; and wherein the conductor portion comprises a slanted lower surface contacting the elastic member;
    whereby the upper plunger, when pressed, is laterally displaced toward the electrically conducting portion by a restitution force of the compressed elastic member, so as to press the upper plunger into electrical contact with the electrically conducting portion.

2. The testing apparatus according to claim 1, wherein the probe further comprises an electrically-conductive lower plunger disposed below the elastic member, and wherein the lower plunger includes a slanted upper surface contacting the elastic member;
    whereby, when the elastic member is compressed, the lower plunger is laterally displaced toward the electrically conducting portion by the restitution force of the compressed elastic member, so as to press the lower plunger into electrical contact with the electrically conducting portion.

3. The testing apparatus according to claim 2, wherein a bottom end of the elastic member slips along the slanted upper surface of the lower plunger.

4. The testing apparatus according to claim 1, wherein the electrically conducting portion on the inside wall of each hole is formed of a multi-layer material which includes a copper layer plated on the inside wall, and a gold layer plated on the copper layer; whereby oxidation of the electrically conducting portion is prevented.

5. The testing apparatus according to claim 1, wherein the slanted lower surface comprises a slanted base of a column member and a top end of the elastic member slips along the slanted base.

6. The testing apparatus according to claim 1, wherein the substrate wiring is electrically connected with the electrically conducting portions at an intermediate position along a length of the electrically conducting portion.

* * * * *